United States Patent
Wiatrowski et al.

(10) Patent No.: US 7,500,170 B2
(45) Date of Patent: Mar. 3, 2009

(54) METHOD AND APPARATUS FOR ERROR DETECTION IN A DATA BLOCK

(75) Inventors: David G. Wiatrowski, Woodstock, IL (US); Thomas B. Bohn, McHenry, IL (US); Kevin G. Doberstein, Elmhurst, IL (US); Donald G. Newberg, Hoffman Estates, IL (US)

(73) Assignee: Motorola, Inc., Schaumburg, IL (US)

( * ) Notice: Subject to any disclaimer, the term of this patent is extended or adjusted under 35 U.S.C. 154(b) by 214 days.

(21) Appl. No.: 11/464,369

(22) Filed: Aug. 14, 2006

(65) Prior Publication Data

US 2008/0052603 A1   Feb. 28, 2008

(51) Int. Cl.
*H03M 13/00* (2006.01)

(52) U.S. Cl. .................. 714/758; 714/41; 714/48; 714/703; 714/799

(58) Field of Classification Search .......... 714/41, 714/703, 758, 799
See application file for complete search history.

(56) References Cited

U.S. PATENT DOCUMENTS

| | | | | |
|---|---|---|---|---|
| 5,574,855 A * | 11/1996 | Rosich et al. | ................. | 714/41 |
| 6,233,073 B1 * | 5/2001 | Bowers et al. | ................. | 398/16 |
| 6,622,268 B2 * | 9/2003 | Holman | ....................... | 714/701 |
| 6,631,481 B1 * | 10/2003 | Hoard et al. | ................... | 714/41 |
| 6,704,894 B1 * | 3/2004 | Kania | ........................... | 714/724 |
| 6,751,756 B1 * | 6/2004 | Hartnett et al. | ................ | 714/54 |
| 2005/0002476 A1 * | 1/2005 | Ben Rached et al. | ......... | 375/341 |
| 2007/0208977 A1 * | 9/2007 | Clark et al. | .................. | 714/728 |

\* cited by examiner

*Primary Examiner*—Esaw T Abraham
(74) *Attorney, Agent, or Firm*—Valerie M. Davis (57) ABSTRACT

A transmitting device generates a data block including a first field having a first plurality of bits that includes an error detection portion and a second field having a second plurality of bits; selects an error injection mask based on the second plurality of bits; modifies the first plurality of bits with the error injection mask to generate a modified first plurality of bits; and transmits the data block to a receiving device. The receiving device decodes the second plurality of bits to generate decoding results; selects an error injection mask based on the decoding results; modifies the first plurality of bits using the error injection mask to generate a modified first plurality of bits that includes a resultant error detection value indicated in the error detection portion; and detects whether the decoding results for the second field are correct based on the resultant error detection value.

20 Claims, 9 Drawing Sheets

METHOD AND APPARATUS FOR ERROR DETECTION IN A DATA BLOCK

FIELD OF THE INVENTION

The present invention relates generally to data communications and more specifically to performing error detection in one field of a data block using the error detection mechanism in a different field of the same data block.

BACKGROUND OF THE INVENTION

When communicating data blocks between transmitting and receiving devices in a communication system over a wireless interface, typically some type of error detection and error correction mechanism is used to assist in the decoding of each data block at the receiving device for enabling further processing of the data block. Herein, a data block is generally defined as a block of continuous bits containing information and/or signaling, and decoding is defined as the initial processing of a received data block to identify the received bits (e.g., as 1s or 0s) and may include, detecting and/or correcting errors in the received bits. Signaling is concerned with the establishment and control of connections in a network.

Generally, a data block has a predetermined logical structure having a plurality of different types of fields for organizing the bits in the data block, and one or more or these fields may contain bits that enable the error detection and/or error correction for that field. However, depending on the protocol used, some fields may include error correction bits but not error detection bits or limited error detection bits because of a bit number constraint due to, for instance, bandwidth constraints associated with the physical channels over which the data block is sent. A resulting limitation is that an inability to detect decoding errors in some fields can cause fairly substantial problems related to the further processing of the data block if there are, in fact, errors that go undetected.

An example of an air interface protocol that has a data block structure that includes fields having error correction but not error detection is the air interface protocol defined in accordance with the ETSI (European Telecommunications Standards Institute) TS (Technical Specification) 102 361-1. A data block structure identified in this technical specification is a burst, which is defined as the smallest predefined block of continuous bits containing information or signaling. More particularly described therein is a DMR (Digital Mobile Radio) TDMA (Time Division Multiple Access) burst. The DMR TDMA burst includes, for instance, a Data Type field that identifies the type of data being transmitted in an Information field, which is also included in the burst. There are a number of data types mentioned in the technical specification including, e.g., Voice LC Header, Terminator with LC, CSBK, Data Header, etc. Since this field is subject to error correction (in this case forward error correction (FEC), which is well known in the art) but not error detection, it is not possible for a receiver to know whether the error correction on the Data Type field was successful. Because of this, it may be possible under certain error conditions for some burst types to be processed incorrectly.

For illustrative purposes, following are two examples of problems that may arise due to a failure to detect an incorrectly identified data type. In one example, a CSBK could mistakenly be interpreted as a Data Header (which is a first burst of a multi-burst data message), due to uncorrectable errors on the channel. Since a Data Header contains a Blocks to Follow field specifying how many additional bursts belong to this transmission and a CSBK does not, the receiver treats the subsequent bursts as part of that data transmission. Accordingly, other transmissions, such as new voice transmissions, CSBKs, and new data transmissions, are missed during this period.

As another example, a Terminator with LC could mistakenly be interpreted as a Voice LC Header. As many Terminator with LC bursts are typically transmitted during Call Hangtime, the potential side effects include causing a receiver to begin processing a new voice transmission when none exists.

Therefore, it is desirable to have a method and apparatus to provide reliable error detection for a field without or with limited bits reserved for error detection.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION OF THE INVENTION

Before describing in detail embodiments that are in accordance with the present invention, it should be observed that the embodiments reside primarily in combinations of method steps and apparatus components related to a method and apparatus for error detection in a data block. Accordingly, the apparatus components and method steps have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein. Thus, it will be appreciated that for simplicity and clarity of illustration, common and well-understood elements that are useful or necessary in a commercially feasible embodiment such as, for instance, Forward Error Correction (FEC) and Interleaving, may not be depicted in order to facilitate a less obstructed view of these various embodiments.

It will be appreciated that embodiments of the invention described herein may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and apparatus for error detection in a data block described herein. The non-processor circuits may include, but are not limited to, a radio receiver, a radio transmitter and user input devices. As such, these functions may be interpreted as steps of a method to perform the error detection in a data block described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the approaches could be used. Both the state machine and ASIC are also considered herein as a "processing device" for purposes of the foregoing discussion and claim language.

Generally speaking, pursuant to the various embodiments, reliable error detection is performed for a field in a data block with no or limited error detection bits. The embodiments may be applied to any data block structure including a DMR TDMA burst as defined in LTSI TS 102 361-1. For example, upon the generation of a burst having (among other fields) an Information field with data bits and error detection bits (also referred to herein as error detection "parity") and further having a Data Type field identifying the type of data bits in the Information field, an error injection mask is selected based on the identified data type. The mask is applied to the data bits and error detection parity to (usually) modify the data bits, the error detection parity or both. The resultant burst is then transmitted to a receiving device. The receiving device receives the burst; identifies the data type; selects an error injection mask that corresponds to the identified data type and applies the error injection mask to the received data bits and error detection parity in the Information field. Once applied, the resultant data bits and error detection bits can be used to confirm (under certain conditions) that the data type was correctly identified.

This gives an advantage of reliable error detection for the Data Type field to guard against problems identified above in communications between transmitting and receiving devices. Those skilled in the art will realize that the above recognized advantages and other advantages described herein are merely exemplary and are not meant to be a complete rendering of all of the advantages of the various embodiments of the present invention.

Figure 1:
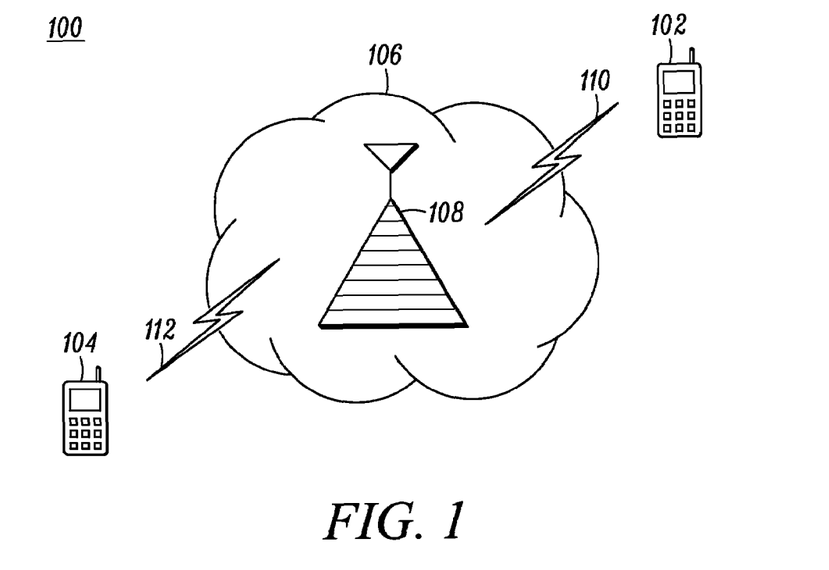
FIG. 1 illustrates an exemplary system implementing embodiments of the present invention.

Referring now to the drawings, and in particular FIG. 1, an exemplary wireless communication system implementing embodiments in accordance with the present invention is shown and indicated generally at 100. Those skilled in the art, however, will recognize and appreciate that the specifics of this illustrative example are not specifics of the invention itself and that the teachings set forth herein are applicable in a variety of alternative settings. For example, since the teachings described do not depend on the type of air interface protocol or channel access scheme used (e.g., TDMA (Time Division Multiple Access), CDMA (Code Division Multiple Access), FDMA (Frequency Division Multiple Access), and the like), the teachings can be applied to any type of air interface protocol and channel access scheme, although the air interface protocol (for a Digital Mobile Radio using a TDMA channel access scheme) as defined in ETSI TS 102 361-1 is described in embodiments herein. In addition, the teachings herein can be applied within any system and with any protocol that utilize an error detection mechanism for reliable transmission and receipt of data blocks, including systems utilizing wireline links. As such, other alternative implementations of using different types of wireline or wireless protocols and channel access schemes are contemplated and are within the scope of the various teachings described.

Wireless communication system 100 comprises a communication device 102 and a communication device 104 that may be for example, a portable or mobile radio, a Personal Digital Assistant, a cellular telephone, and the like. For purposes of the following discussions, the communication devices will be referred to as "radios", but they are also referred to in the art as mobile stations, mobile equipment, handsets, etc. Moreover, in this exemplary embodiment radios 102 and 104 communicate over a radio access network 106. However, those of ordinary skill in the art will realize that any type of network is within the scope of the teachings herein. Network 106 may comprise infrastructure such as, but not limited to, base stations (BS) (with a single BS 108 shown for clarity), base station controllers (not shown), network elements (such as a mobile switching center, home location register, visitor location register, etc.), and the like, to facilitate the communications between radios having access to the network.

For example, radio 102 and radio 104 may communicate with each other by radio 102 establishing a wireless link or radio connection 110 with BS 108 over an available radio frequency (RF) channel and radio 104 establishing a wireless link 112 with BS 108 over an available radio frequency (RF) channel. As is well understood in the art, BS 108 generally comprises a repeater device that can receive a signal from radio 102 over link 110 and retransmit the signal to radio 104 over link 112 or can receive a signal from radio 104 over link 112 and retransmit the signal to radio 102 over link 110. For ease of illustration, only two radios and one BS is shown. However, those skilled in the art will realize that in a typical system a much larger number of radios are supported by a radio network, which has many more BSs than is shown in FIG. 1. Moreover, although in this embodiment communication between radios 102 and 104 are illustrated as being facilitated by BS 108, radios 102 and 104 may communicate using a direct mode of operation without a BS. The teachings herein are equally applicable to direct mode operation between two radios.

Since network 106 is a wireless network, meaning that it supports a wireless or air interface protocol for signal transmission, both of the radios 102 and 104 and BS 108 comprise transceiver devices that include transmitter and receiver apparatus for, respectively, transmitting and receiving RF signals. Radios 102 and 104 and BS 108 further comprise one or more of the processing devices mentioned above (for example a DSP, a microprocessor, etc.) and typically some type of conventional memory element for performing (among other functionality) the air interface protocol and channel access scheme supported by network 106.

Using these protocols, radios 102 and 104 can generate RF signals containing one or more data blocks comprising a plurality of fields for organizing the continuous bits of information and/or signaling for transmission to another radio. As mentioned above, some of these fields may not include error detection or may include limited error detection to verify whether the bits in the field were received and decoded correctly. In accordance with embodiments described herein error detection for a field without or with limited error detection bits can be performed using a field that does contain error detection bits.

Figure 2:
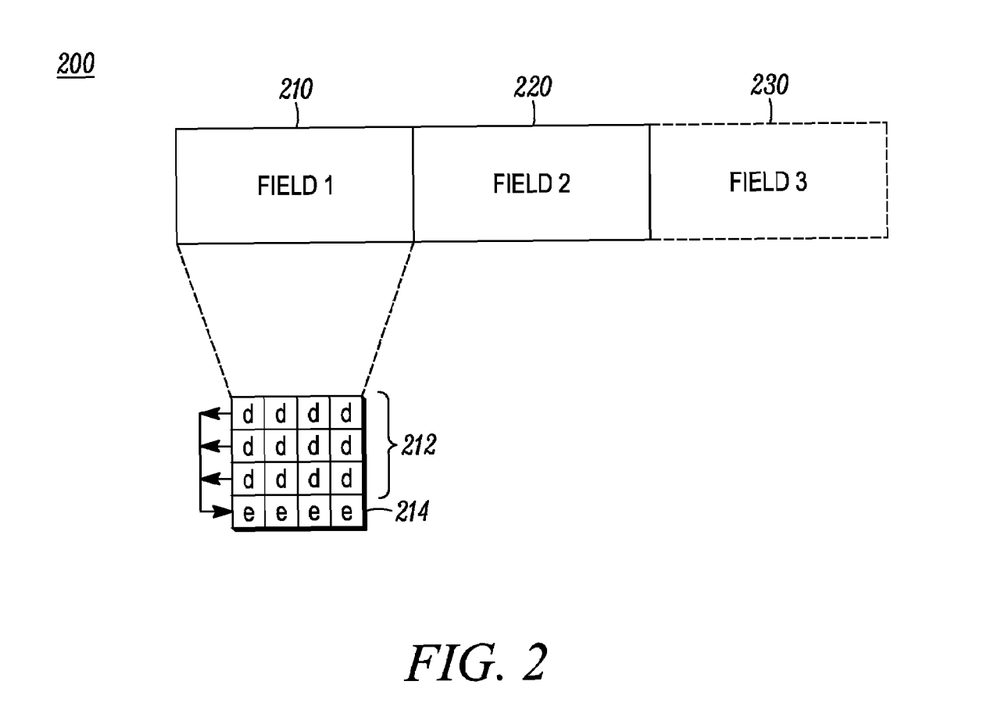
FIG. 2 illustrates an exemplary data block in accordance with embodiments of the present invention.

Turning now to FIG. 2, an exemplary data block in accordance with embodiments herein is shown and generally indicated at 200. Data block 200 can be generated in radio 102 or 104 and has a general logical structure comprising a field 1 (210) and a field 2 (220) for organizing the bits of information and/or signaling being transmitted from radio 102 or 104 to another radio attached to network 106. In the embodiments illustrated by reference to FIGS. 3-8, field 220 has no error detection. So field 210 (which includes error detection) is used to perform reliable error detection for field 220 in accordance with the teachings herein. The teachings herein are not limited by the particular information and/or signaling contained in fields 210 and 220 or the particular logical structure of data block 200, as long as at least one field contains error detection.

Further illustrated in FIG. 2 is an expanded view of field 210 showing a plurality of bits comprised therein, which includes data bits 212 and error detection bits 214, with the error detection bits being calculated based on the data bits. It should be noted that the arrows from the data bits to the error detection bits are not part of field 210 but merely serve to indicate pictorially that the error detection bits are calculated from the data bits. Error detection may be performed using mechanisms such as, for instance, Cyclic Redundancy Check (CRC), Checksum, and a Simple Parity Check, to name a few. These error detection techniques are well known in the art and will not be further explained for the sake of brevity.

Only a limited number of fields are shown for simplicity in illustrating various embodiments described herein. However, skilled artisans will realize that the data block 200 can comprise any number of fields and any structure of those fields as is determined by the various protocols supported by the network and implemented in the communications devices. For example, data block 200 may further comprise an additional field 3 (230), shown in dashed lines. Field 230 may also lack error detection bits or may have limited error detection bits, wherein the error detection mechanism in field 210 may be further used in another embodiment for error detection of field 230 (and of field 220), as illustrated by reference to FIG. 9. In addition, although not shown for the sake of simplicity, fields 210 and 220 (and 230) typically also include some type of error correction mechanism such as, for instance, FEC (forward error correction). These error correction techniques are well known in the art and will not be further described here for the purposes of brevity.

Figure 3:
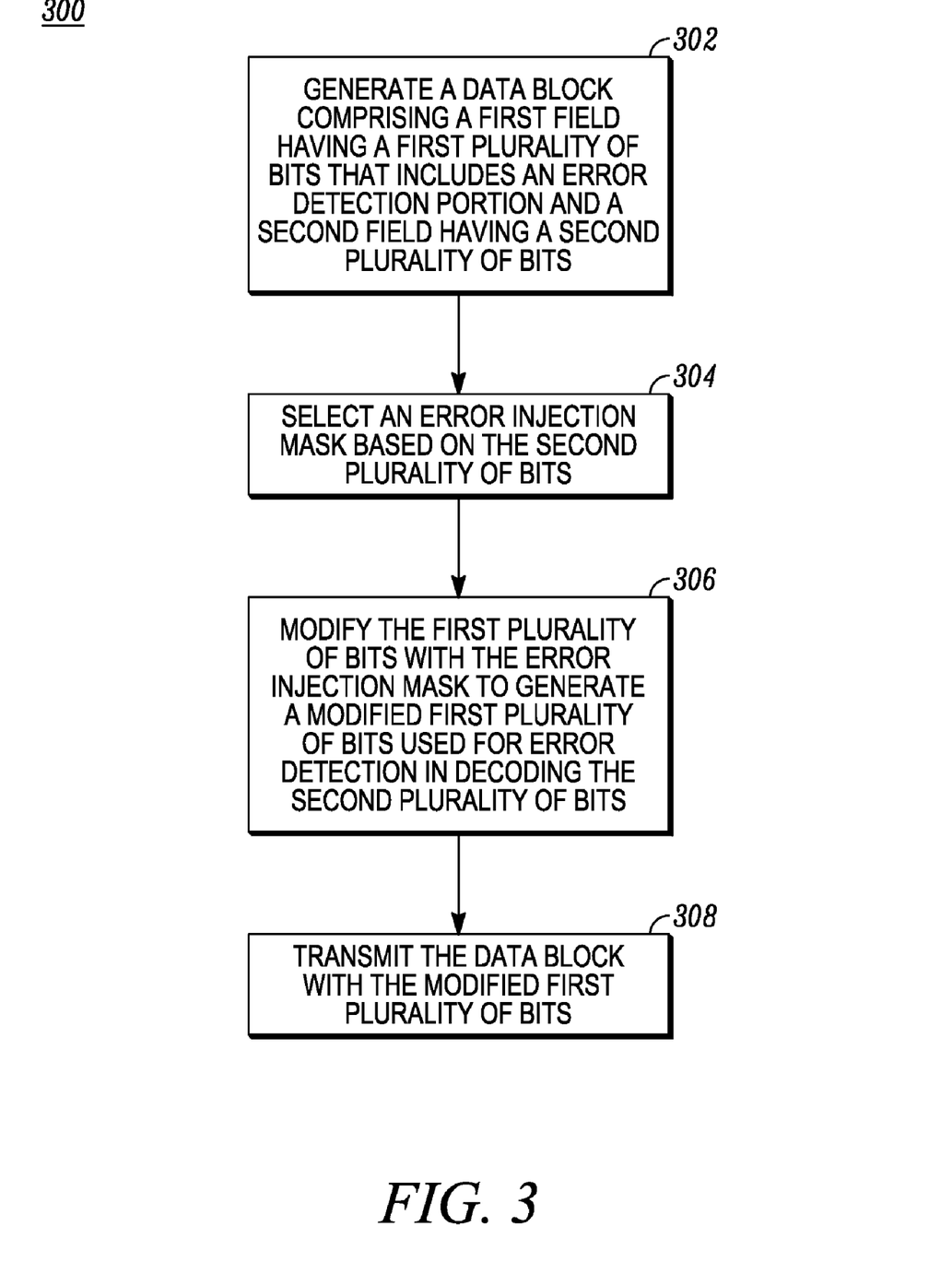
FIG. 3 illustrates a method for error detection in accordance with an embodiment of the present invention.
Figure 4:
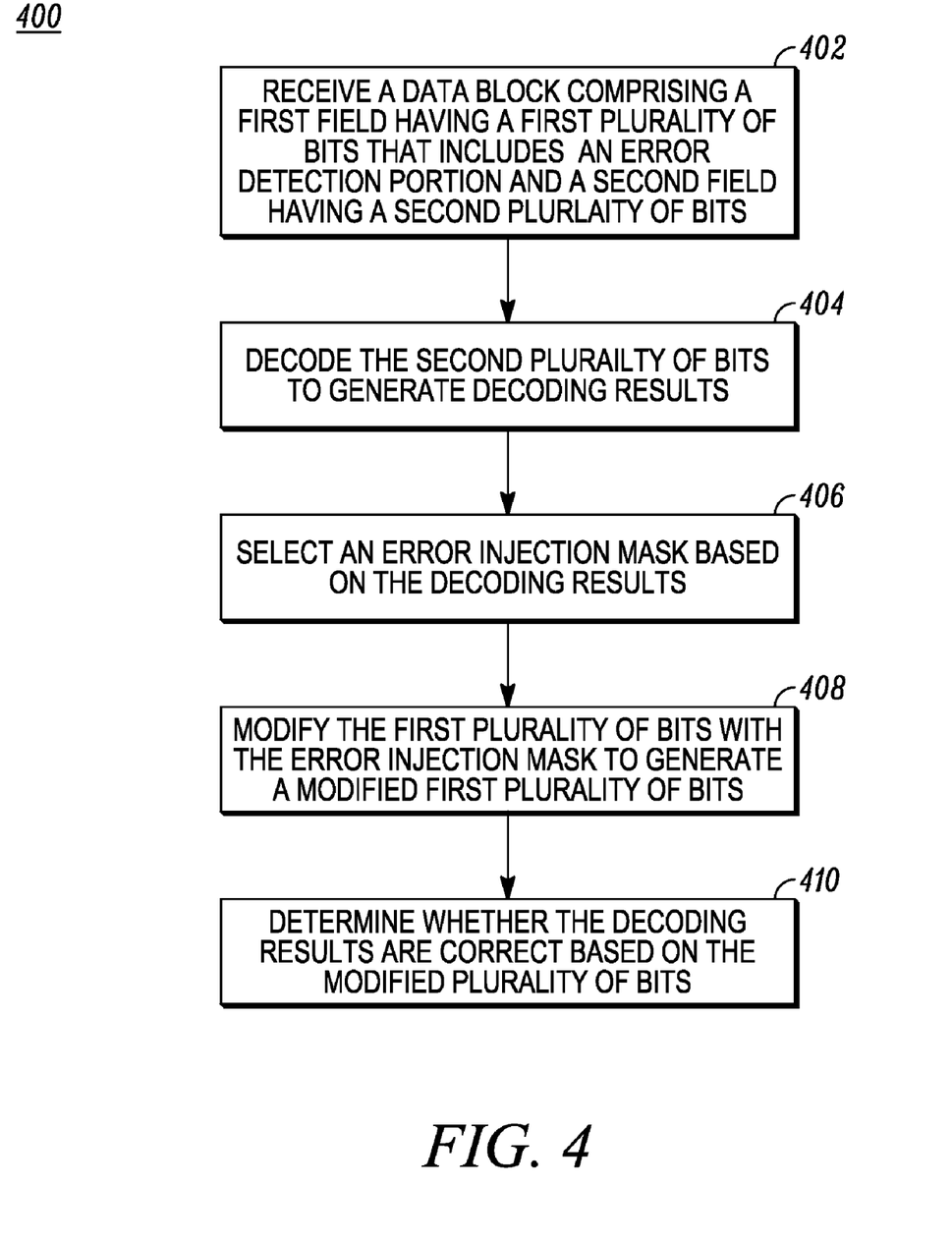
FIG. 4 illustrates a method for error detection in accordance with an embodiment of the present invention.

FIGS. 3 and 4 illustrate methods for error detection in a data block in accordance with embodiments of the present invention. FIG. 3 is a method performed in a transmitting device, and FIG. 4 is a method performed in a receiving device. The methods described by reference to FIGS. 3 and 4 can be performed in the communication devices, the BS and a base station controller, for example, using a processing device that can comprise one or more of the processing devices described above such as, for instance, a DSP.

Turning now to FIG. 3, a method 300 performed in a transmitting device (e.g., radio 102) includes a step 302 of generating a data block comprising a first field (e.g., 210) having a first plurality of bits that includes an error detection portion (e.g., 214) indicating an error detection value based on another portion (e.g., 212) of the first plurality of bits and used for error detection in decoding the other portion (212) of the first plurality of bits, and the data block further comprising a second field (e.g., 220) having a second plurality of bits (not shown in FIG. 3). The error detection value is identified or indicated by the bits ("e") in the error detection portion 214 of field 210, and this value is calculated based on the type of error detection technique used in the transmitting device.

At a step 304, an error injection mask is selected based on the second plurality of bits in field 220. The error injection mask can be implemented in any number of forms, but in general comprises a predetermined number of bits representing a particular mask value. The mask value, in turn, corresponds to the value represented by the bits included in field 220. Typically, for a given number, N, of different values that can be represented as bit values in the second field, there are at least, N, different mask values that correspond to the bit values in the second field. Exemplary mask values are given below for the embodiment explained by reference to FIGS. 10 through 12.

At a step 306 the first plurality of bits is "modified" with the error injection mask to generate a "modified" first plurality of bits that is used for error detection in decoding the second plurality of bits. The phrase "modifying the first plurality of bits with an error injection mask" is used synonymously with the phrase "applying an error injection mask to the first plurality of bits", and both refer in general to processing whereby at least a portion of the first plurality of bits in the field 210 is combined with an error injection mask (value) using some type of arithmetic operation. In one embodiment, for example, the arithmetic operation is bitwise modulo 2 addition, wherein if the sum of two bits is "2" then the value of this sum is represented as a zero, i.e. 1+1=0. However, it should be understood by those of ordinary skill in the art that other type of arithmetic could be used such as, for instance, Galois Field arithmetic.

Moreover, the phrase "modified first plurality of bits" does not necessarily mean that one or more bit values in the first plurality of bits is changed after applying the error injection mask, even though this is usually the case. This is because an error injection mask having a value of zero may be selected, which would result in no change to the first plurality of bits. Accordingly, "modified first plurality of bits" means that the error injection mask has been applied to the first plurality of bits, irrespective of whether it resulted in a bit value being changed.

At a step 308, the data block with the error injection mask applied to the first plurality of bits in field 210 is transmitted to a receiving device (e.g., radio 104). FIG. 4 illustrates a method 400 performed in radio 104 upon (at a step 402) receiving the data block 200 having the error injection mask applied to the first plurality of bits included in field 210, and the data block 200 further having field 220 with the second plurality of bits.

Thereafter, at a step 404 the receiving device decodes the second plurality of bits to generate decoding results for the field 220. In general and as stated above, decoding means identifying the bits and, usually, also at least includes performing some type of error correction on the received bits. Any type of decoding process may be used in conjunction with the teachings herein, including, but not limited to those listed above. At a step 406, an error injection mask is selected that corresponds to the decoding results from field 220. At a step 408, the first plurality of bits in field 210 are modified using the selected error injection mask to generate a modified first plurality of bits. Based upon these modified first plurality of bits, it can be (at a step 410) determined (among other things) whether the decoding results are correct using, for instance, further processing techniques as discussed below.

For example, in one implementation an error detection calculation can be performed on just some of the bits (e.g., 212) in the modified first plurality of bits and the calculated error detection value compared to the error detection value that was in field 210 of the received data block prior to the error detection calculation. This implementation is illustrated with respect to the embodiments shown in FIGS. 5 through 9. For simplicity of illustration, only field 210 of data block 200 is shown since this is the field to which the mask is applied and upon which error detection calculations are made. In another implementation, an error detection calculation can be performed on all modified first plurality of bits inclusive of the error detection bits, and the calculated error detection value compared to a predetermined value (e.g., a zero value).

Figure 5:
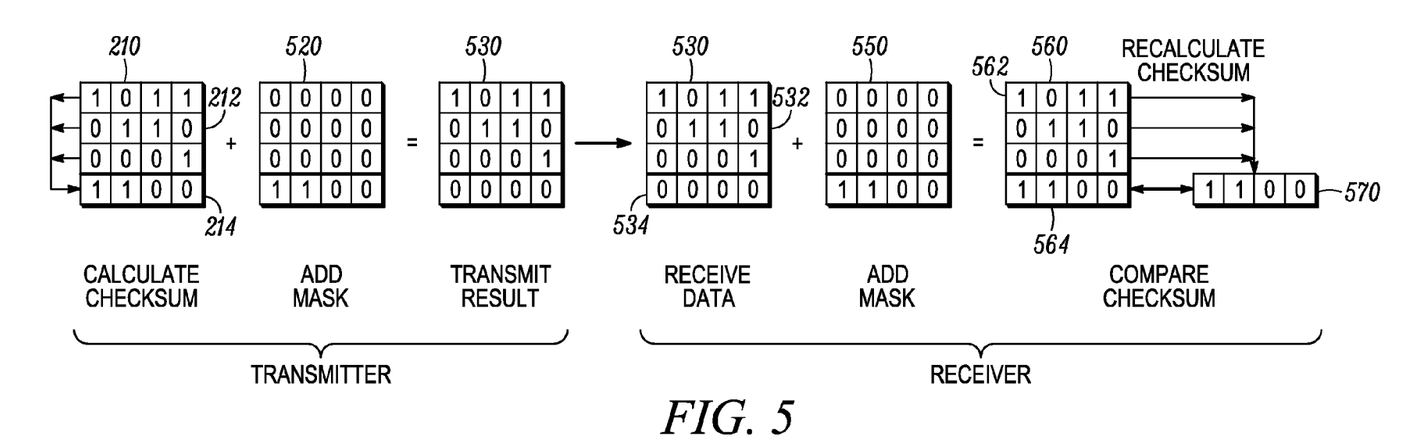
FIG. 5 illustrates exemplary error detection in the data block shown in FIG. 2 using the methods shown in FIGS. 3 and 4.

In all of the FIGS. 5 through 9, field 210 in data block 200 is being processed in accordance with the teachings herein. However field 210 is shown as having a different reference number as a result of the error injection mask being applied thereto. Turning now to FIG. 5, an embodiment is shown wherein, in the transmitting device, a selected error injection mask 520 (which is selected based on the bit values in field 220) is combined (using bitwise modulo 2 addition) with the data bits 212 and error detection bits 214 in field 210 to modify only the error detection bits 214, resulting in a modified field 530. Data block 200 including field 530 and field 220 is transmitted and received in the receiving device.

At the receiving device, a selected error injection mask 550 (which is selected based on the decoded bit values in field 220) is combined (using bitwise modulo 2 addition) with the data bits 532 and error detection bits 534 in field 530 to modify only the error detection bits 534, resulting in a modified field 560. An error detection calculation (in this example a Checksum calculation) is applied to data bits 562 and a calculated Checksum 570 is compared to error detection bits 564. If the two values are equal, then it can be concluded that field 220 was properly decoded, and normal processing can be continued in the receiving device, which is dependent on the type of data block received. If the two values are not equal, then it can be concluded that an error has occurred (e.g., in decoding the bits in field 220, in decoding the data bits 532, or both) and the receiving device performs error handling including, but not limited to, discarding the received data block and sending a NACK (negative acknowledgement message) to the transmitting device or just simply discarding the received data block. In this example, the results indicate that field 220 has been properly decoded.

Figure 6:
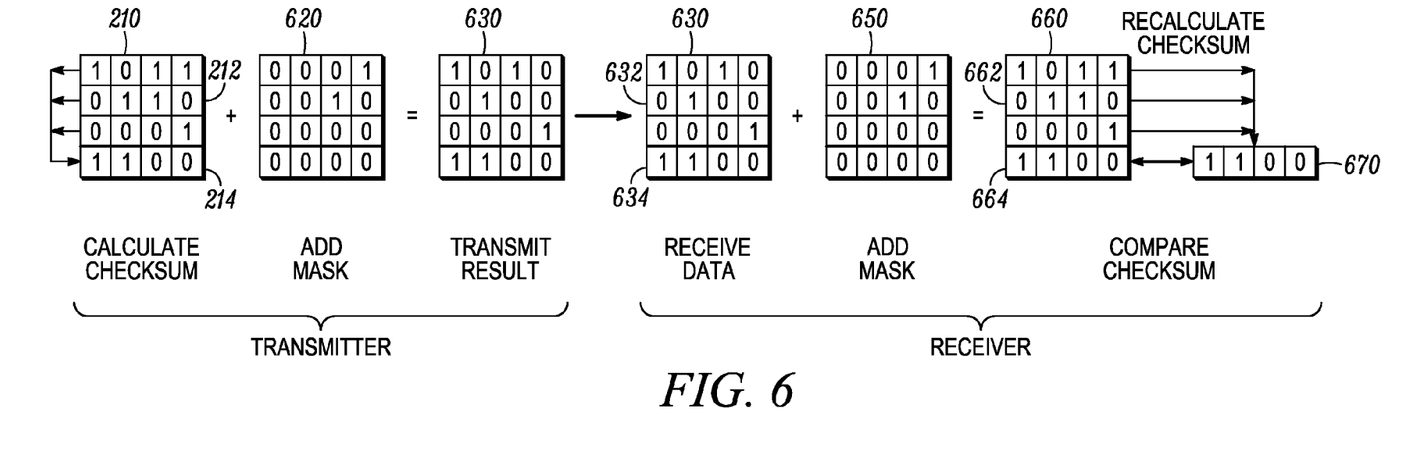
FIG. 6 illustrates exemplary error detection in the data block shown in FIG. 2 using the methods shown in FIGS. 3 and 4.

Turning now to FIG. 6, an embodiment is shown wherein, in the transmitting device, a selected error injection mask 620 (which is selected based on the bit values in field 220) is combined (using bitwise modulo 2 addition) with the data bits 212 and error detection bits 214 in field 210 to modify only the data bits 212, resulting in a modified field 630. Data block 200 including field 630 and field 220 is transmitted and received in the receiving device.

At the receiving device, a selected error injection mask 650 (which is selected based on the decoded bit values in field 220) is combined (using bitwise modulo 2 addition) with the data bits 632 and error detection bits 634 in field 630 to modify only the data bits 632, resulting in a modified field 660. An error detection calculation (in this example a Checksum calculation) is applied to data bits 662 and a calculated Checksum 670 is compared to error detection bits 664. If the two values are equal, then it can be concluded that field 220 was properly decoded, and normal processing can be contin-
ued in the receiving device, which is dependent on the type of data block received. If the two values are not equal, then it can be concluded that an error has occurred (e.g., in decoding the bits in field 220, in decoding the data bits 632, or both) and the receiving device should perform error handling. In this example, the results indicate that field 220 has been properly decoded.

Figure 7:
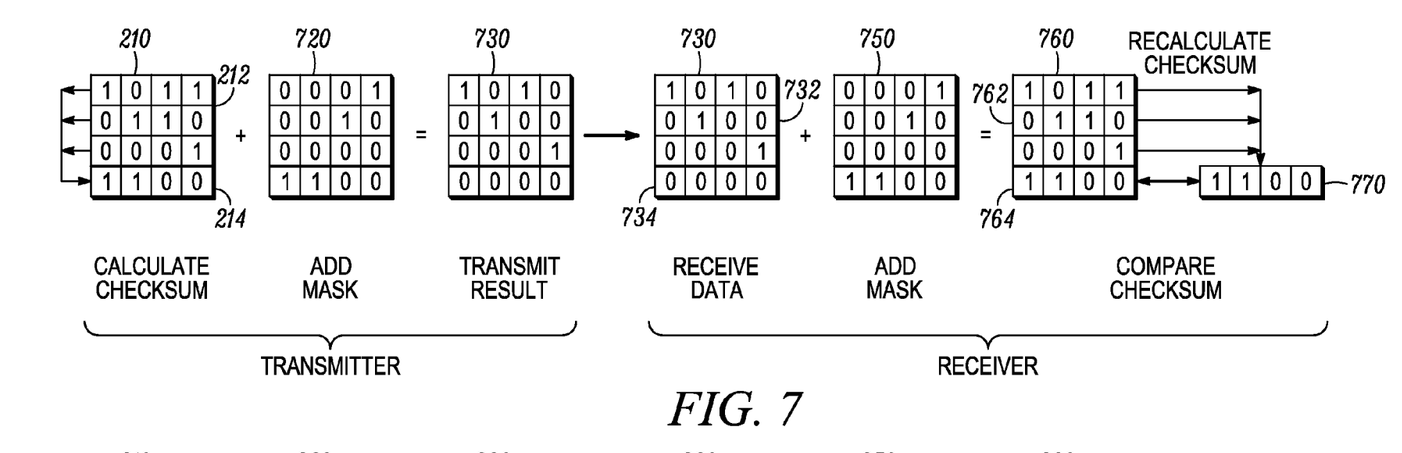
FIG. 7 illustrates exemplary error detection in the data block shown in FIG. 2 using the methods shown in FIGS. 3 and 4.

Turning now to FIG. 7, an embodiment is shown wherein, in the transmitting device, a selected error injection mask 720 (which is selected based on the bit values in field 220) is combined (using bitwise modulo 2 addition) with the data bits 212 and error detection bits 214 in field 210 to modify both the data bits 212 and the error detection bits 214, resulting in a modified field 730. Data block 200 including field 730 and field 220 is transmitted and received in the receiving device.

At the receiving device, a selected error injection mask 750 (which is selected based on the decoded bit values in field 220) is combined (using bitwise modulo 2 addition) with the data bits 732 and error detection bits 734 in field 730 to modify both the data bits 732 and the error detection bits 734, resulting in a modified field 760. An error detection calculation (in this example a Checksum calculation) is applied to data bits 762 and a calculated Checksum 770 is compared to error detection bits 764. If the two values are equal, then it can be concluded that field 220 was properly decoded, and normal processing can be continued in the receiving device, which is dependent on the type of data block received. If the two values are not equal, then it can be concluded that an error has occurred (e.g., in decoding the bits in field 220, in decoding the data bits 732, or both) and the receiving device should perform error handling. In this example, the results indicate that field 220 has been properly decoded.

Figure 8:
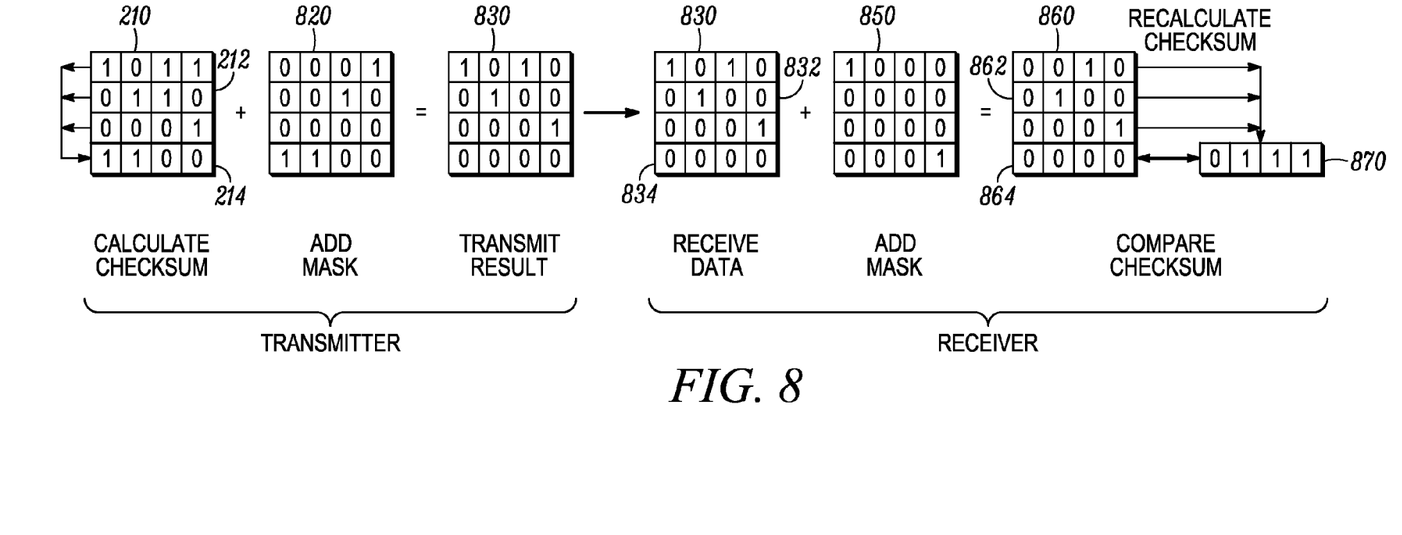
FIG. 8 illustrates exemplary error detection in the data block shown in FIG. 2 using the methods shown in FIGS. 3 and 4.

Turning now to FIG. 8, an embodiment is shown wherein, in the transmitting device, a selected error injection mask 820 (which is selected based on the bit values in field 220) is combined (using bitwise modulo 2 addition) with the data bits 212 and error detection bits 214 in field 210 to modify both the data bits 212 and the error detection bits 214, resulting in a modified field 830. Data block 200 including field 830 and field 220 is transmitted and received in the receiving device.

At the receiving device, a selected error injection mask 850 (which is selected based on the decoded bit values in field 220) is combined (using bitwise modulo 2 addition) with the data bits 832 and error detection bits 834 in field 830 to modify both the data bits 832 and the error detection bits 834, resulting in a modified field 860. An error detection calculation (in this example a Checksum calculation) is applied to data bits 862 and a calculated Checksum 870 is compared to error detection bits 864. If the two values are equal, then it can be concluded that field 220 was properly decoded, and normal processing can be continued in the receiving device, which is dependent on the type of data block received. If the two values are not equal, then it can be concluded that an error has occurred (e.g., in decoding the bits in field 220, in decoding the data bits 832, or both) and the receiving device should perform error handling. In this example, the results indicate that field 220 has not been properly decoded.

Figure 9:
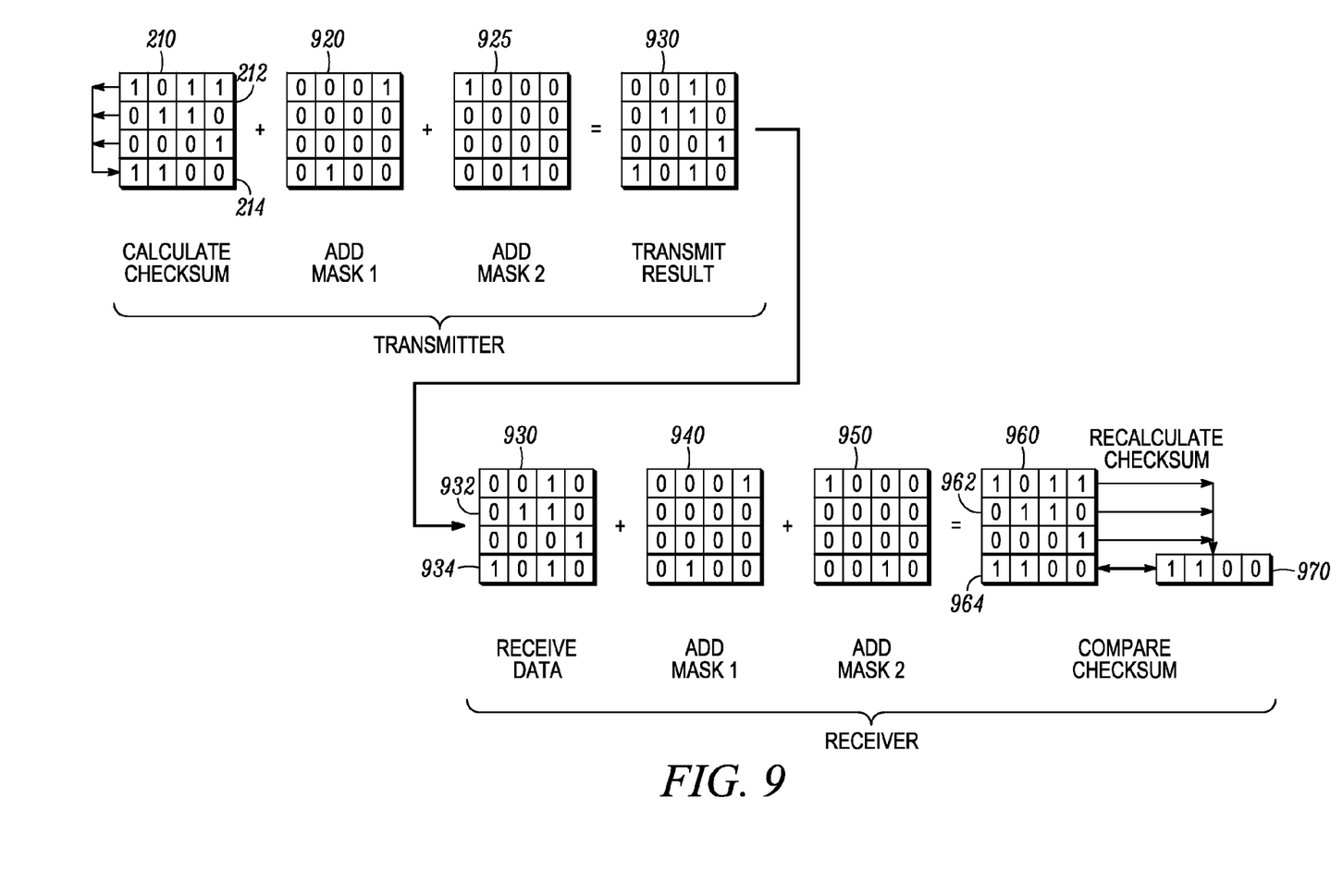
FIG. 9 illustrates exemplary error detection in the data block shown in FIG. 2 using the methods shown in FIGS. 3 and 4.

Turning now to FIG. 9, an embodiment is shown wherein, multiples masks are applied to the data bits 212 and error detection bits 214 of field 220 to detect errors in decoding the bits of multiple fields in data block 200, each of which have no error detection bits or limited error detection bits. In the particular illustration shown in FIG. 2, two masks are applied (one corresponding to field 220 and the other corresponding to field 230). However, any number of masks can be applied based on the teachings herein. However, care should be taken in selecting the predetermined mask values so that error in more than one field do not potentially cancel each other leading to unreliable results.

In the transmitting device, selected error injection masks 920 (which is selected based on the bit values in field 220) and 925 (which is selected based on the bit values in field 230) are combined (using bitwise modulo 2 addition) with the data bits 212 and error detection bits 214 in field 210 to modify both the data bits 212 and the error detection bits 214, resulting in a modified field 930. Data block 200 including field 930 and fields 220 and 230 is transmitted and received in the receiving device.

At the receiving device, selected error injection masks 940 (which is selected based on the decoded bit values in field 220) and 950 (which is selected based on the decoded bit values in field 230) are combined (using bitwise modulo 2 addition) with the data bits 932 and error detection bits 934 in field 930 to modify both the data bits 932 and the error detection bits 934, resulting in a modified field 960. An error detection calculation (in this example a Checksum calculation) is applied to data bits 962 and a calculated Checksum 970 is compared to error detection bits 964. If the two values are equal, then it can be concluded that field 220 was properly decoded, and normal processing can be continued in the receiving device, which is dependent on the type of data block received. If the two values are not equal, then it can be concluded that an error has occurred (e.g., in decoding the bits in fields 220 or 230, in decoding the data bits 832, or any combination of the three) and the receiving device should perform error handling. In this example, the results indicate that fields 220 and 230 have been properly decoded.

Figure 10:
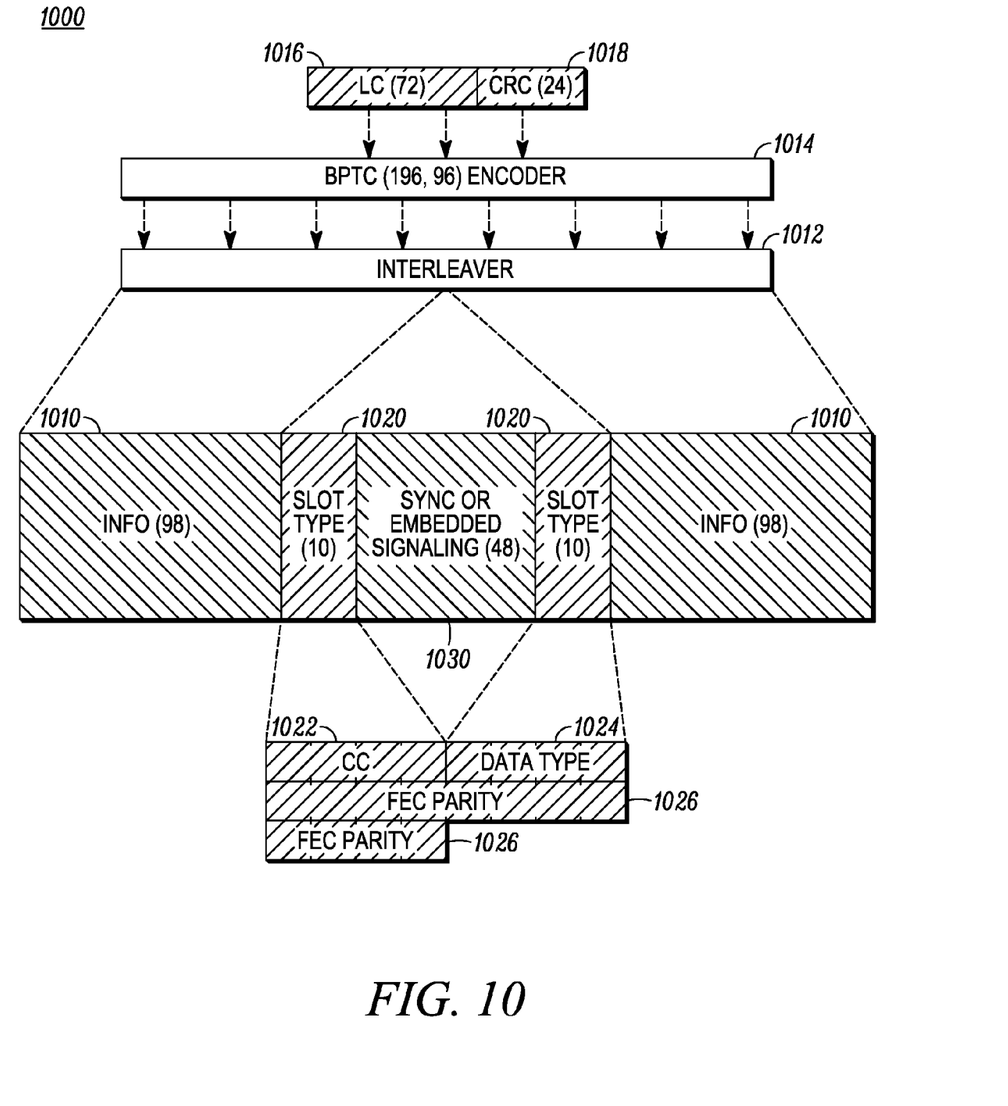
FIG. 10 illustrates an exemplary DMR TDMA burst in accordance with embodiments of the present invention.

FIG. 10 illustrates an exemplary DMR Data and Control burst as defined in ETSI TS 102 361-1. The data and control burst contains an Info field 1010 containing 196 bits of information. In this example, the information consists of Link Control (LC) 1016, error detection (CRC) 1018, and Block Product Turbo Code (BPTC) FEC parity (not shown) added by BPTC (196, 96) Encoder 1014. The data and control burst also contains a 20-bit Slot Type field 1020 that defines the meaning of the information bits. The Slot Type field includes a Color Code (CC) Field 1022, a Data Type field 1024, and FEC Parity 1026 in accordance with ETSI TS 102 361-1. In this example, the Data Type field 1024 could be set to Voice LC Header. The center of the burst contains either a synchronization pattern or embedded signaling information field 1030 in accordance with ETSI TS 102 361-1. Also shown is an Interleaver 1012 in accordance with ETSI TS 102 361-1.

Figure 11:
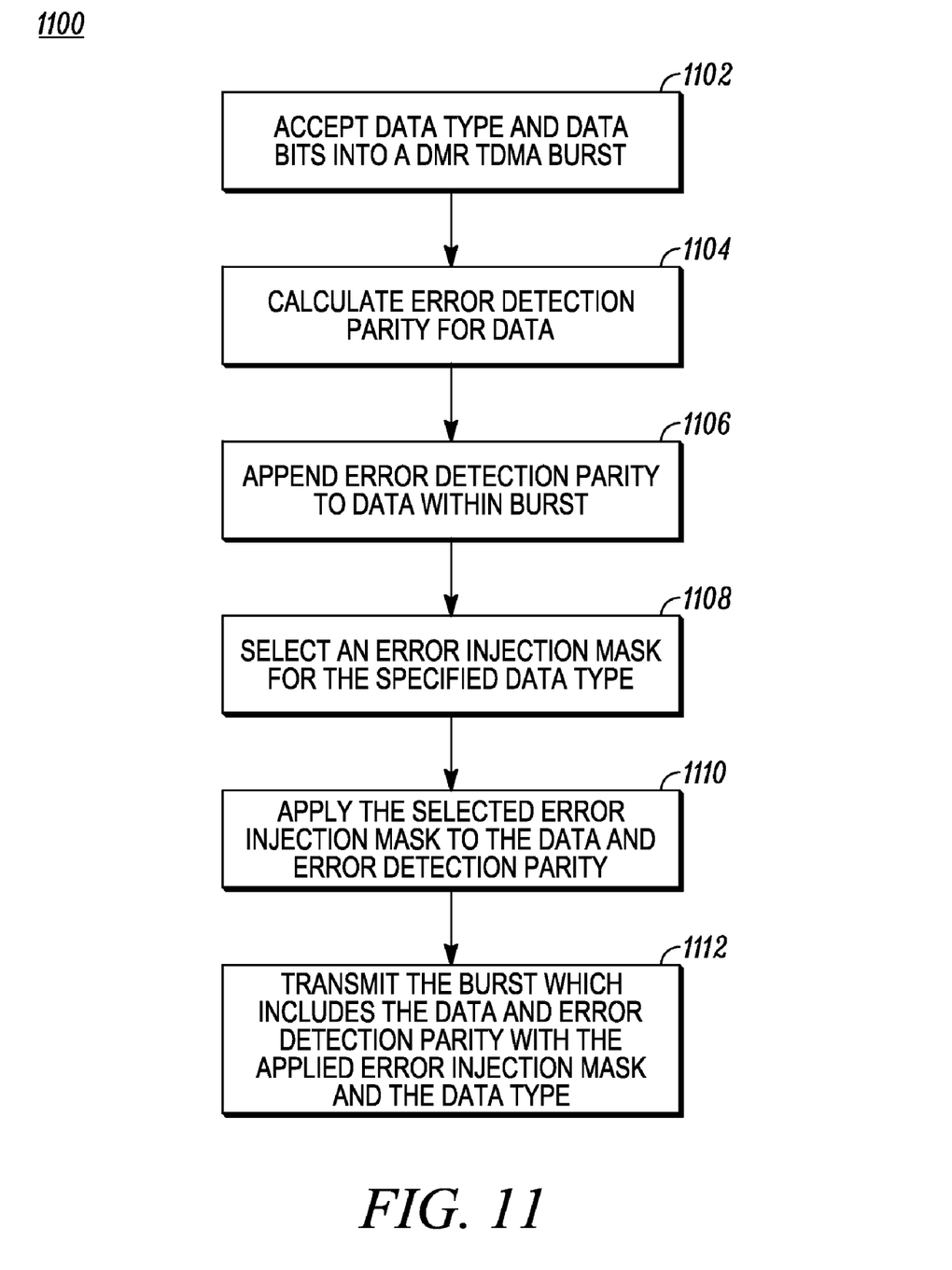
FIG. 11 illustrates a method for error detection in the DMR TDMA burst shown in FIG. 10, in accordance with an embodiment of the present invention.

Turning now to FIG. 11, a method 1100 is shown for error detection in a DMR TDMA burst, such as burst 1000, in accordance with an embodiment of the present invention. In this embodiment, a transmitting device generates a DMR TDMA burst 1000 in accordance with the teachings herein that enables error detection of data type bits 1024 in the Slot Type field 1020 using the error detection mechanism in the Information field 1010. It should be noted that with respect to this exemplary burst 1000, only the data and/or error detection parity in Information field 1010 are "modified" in accordance with the teachings herein, and the generation of bits for the remaining fields shown in FIG. 10 are as disclosed in ETSI TS 102 361-1, the generation of which will not be further described herein for the sake of brevity.

At a step 1102 of method 1100, the data type bits 1024 and data bits (in this case LC bits) 1016 are generated and accepted, respectively, into the Slot Type field 1020 and the Information field 1010 of burst 1000. At a step 1104 error detection parity (e.g., CRC) 1018 is calculated for the LC data bits 1016 and appended to the LC data bits 1016 within the Information field 1010 of burst 1000, at a step 1106. At a step 1108, the transmitting device selects an error injection mask for the specified data type bits 1024 accepted at step 1102. At a step 1110, the selected error injection mask is applied (using bitwise modulo 2 addition for example) to the LC data bits 1016 and CRC parity 1018 to generate modified LC data bits 1016 and/or CRC parity 1018. At a step 1112, the transmitting device transmits to a receiving device the burst 1000 that includes (among other fields with their corresponding bits, of course) the Slot Type Field 1020 including the data type bits 1024 and the Information Field 1010 including the modified LC data bits 1016 and/or CRC parity 1018.

We now turn back momentarily to step 1108 and 1110 of selecting and applying an error injection mask. Each data type already designated in ETSI TS 102 361-1 is assigned a predetermined error injection mask. Additional error injection masks may also be predetermined and reserved for future data types. Tables 1 and 2 below show exemplary error injection masks that may be assigned to present and future data types. These exemplary data mask are selected based on the specified data type from the table and applied to Information field 1010 to modify only the CRC parity 1018. In this case, since the data type is Voice LC Header the error injection mask $969696_{16}$ corresponding to Voice LC Header is selected and applied to Information field 1010 to modify CRC parity 1018. However, as explained above, in other embodiments error injection masks may be predetermined that would modify only the LC data bits 1016 or both LC data bits 1016 and the CRC parity 1018.

TABLE 1

| Data Type | | 8-bit Mask (base 16) | 9-bit Mask (base 8) | 16-bit Mask (base 16) |
|---|---|---|---|---|
| PI Header | 0 | 69 | 551 | 6969 |
| Voice LC Header | 1 | 96 | 226 | 9696 |
| Terminator with LC | 2 | 99 | 631 | 9999 |
| CSBK | 3 | a5 | 645 | a5a5 |
| MBC Header | 4 | aa | 252 | aaaa |
| MBC Continuation | 5 | c3 | 703 | c3c3 |
| Data Header | 6 | cc | 314 | cccc |
| Rate ½ Data Continuation | 7 | f0 | 360 | f0f0 |
| Rate ¾ Data Continuation | 8 | ff | 777 | ffff |
| Idle | 9 | 00 | 000 | 0000 |
| Reserved for future use | a | 0f | 417 | 0f0f |
| Reserved for future use | b | 33 | 463 | 3333 |
| Reserved for future use | c | 3c | 074 | 3c3c |
| Reserved for future use | d | 55 | 525 | 5555 |
| Reserved for future use | e | 5a | 132 | 5a5a |
| Reserved for future use | f | 66 | 146 | 6666 |

TABLE 2

| Data Type | | 24-bit Mask (base 16) | 32-bit Mask (base 16) |
|---|---|---|---|
| PI Header | 0 | 696969 | 69696969 |
| Voice LC Header | 1 | 969696 | 96969696 |
| Terminator with LC | 2 | 999999 | 99999999 |
| CSBK | 3 | a5a5a5 | a5a5a5a5 |
| MBC Header | 4 | aaaaaa | aaaaaaaa |
| MBC Continuation | 5 | c3c3c3 | c3c3c3c3 |
| Data Header | 6 | cccccc | cccccccc |
| Rate ½ Data Continuation | 7 | f0f0f0 | f0f0f0f0 |
| Rate ¾ Data Continuation | 8 | ffffff | ffffffff |

TABLE 2-continued

| Data Type | | 24-bit Mask (base 16) | 32-bit Mask (base 16) |
| --- | --- | --- | --- |
| Idle | 9 | 000000 | 00000000 |
| Reserved for future use | a | 0f0f0f | 0f0f0f0f |
| Reserved for future use | b | 333333 | 33333333 |
| Reserved for future use | c | 3c3c3c | 3c3c3c3c |
| Reserved for future use | d | 555555 | 55555555 |
| Reserved for future use | e | 5a5a5a | 5a5a5a5a |
| Reserved for future use | f | 666666 | 66666666 |

In another embodiment, error detection for at least one other field in the burst can be performed using the error detection mechanism of the Information field 1010. For example, another field that has no error detection and which can be a second field for which error detection can be performed using the error detection of Information field 1010 is the Color Code (CC) field 922. In this embodiment, a second set of predetermined masks, e.g., shown in Tables 3 and 4 below, can be used to facilitate error detection in the CC field in accordance with the teachings above. Accordingly, at the transmitter device both masks would be applied to modify the CRC parity and two selected masks would be applied at the receiving device to again modify the CRC parity. Error detection could then be performed similar to that described below by reference to FIG. 12.

TABLE 3

| Secondary Field | | 8-bit Mask (base 16) | 9-bit Mask (base 8) | 16-bit Mask (base 16) |
| --- | --- | --- | --- | --- |
| Value 0 | 0 | 6a | 626 | 6996 |
| Value 1 | 1 | 95 | 151 | 9669 |
| Value 2 | 2 | 9a | 546 | 9966 |
| Value 3 | 3 | c0 | 474 | a55a |
| Value 4 | 4 | cf | 063 | aa55 |
| Value 5 | 5 | a6 | 532 | c33c |
| Value 6 | 6 | a9 | 125 | cc33 |
| Value 7 | 7 | f3 | 017 | f00f |
| Value 8 | 8 | fc | 400 | ff00 |
| Value 9 | 9 | 03 | 377 | 00ff |
| Value 10 | a | 0c | 760 | 0ff0 |
| Value 11 | b | 30 | 714 | 33cc |
| Value 12 | c | 3f | 303 | 3cc3 |
| Value 13 | d | 56 | 652 | 55aa |
| Value 14 | e | 59 | 245 | 5aa5 |
| Value 15 | f | 65 | 231 | 6699 |

TABLE 4

| Secondary Field | | 24-bit Mask (base 16) | 32-bit Mask (base 16) |
| --- | --- | --- | --- |
| Value 0 | 0 | 699669 | 69966996 |
| Value 1 | 1 | 966996 | 96699669 |
| Value 2 | 2 | 996699 | 99669966 |
| Value 3 | 3 | a55aa5 | a55aa55a |
| Value 4 | 4 | aa55aa | aa55aa55 |
| Value 5 | 5 | c33cc3 | c33cc33c |
| Value 6 | 6 | cc33cc | cc33cc33 |
| Value 7 | 7 | f00ff0 | f00ff00f |
| Value 8 | 8 | ff00ff | ff00ff00 |
| Value 9 | 9 | 00ff00 | 00ff00ff |
| Value 10 | a | 0ff00f | 0ff00ff0 |
| Value 11 | b | 33cc33 | 33cc33cc |
| Value 12 | c | 3cc33c | 3cc333c3 |
| Value 13 | d | 55aa55 | 55aa55aa |

TABLE 4-continued

| Secondary Field | | 24-bit Mask (base 16) | 32-bit Mask (base 16) |
| --- | --- | --- | --- |
| Value 14 | e | 5aa55a | 5aa55aa5 |
| Value 15 | f | 669966 | 66996699 |

Figure 12:
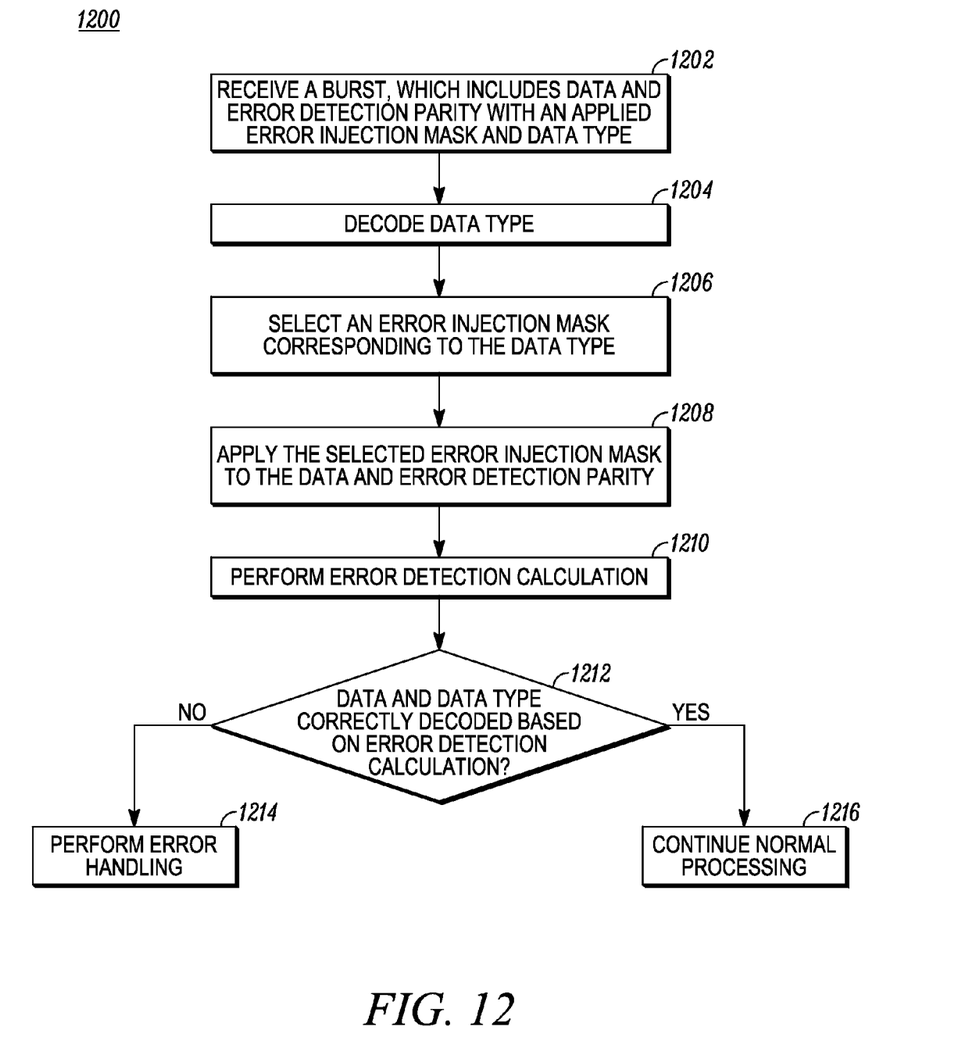
FIG. 12 illustrates a method for error detection in the DMR TDMA burst shown in FIG. 10, in accordance with an embodiment of the present invention.

Turning now to FIG. 12, the receiving device, at a step 1202, receives the burst 1000 from the transmitting device that includes (among other fields with their corresponding bits, of course) the Slot Type Field 1020 including the data type bits 1024 and the Information Field 1010 including the modified LC data bits 1016 and/or CRC parity 1018. At a step 1204 the receiving device decodes the data type bits 1024 in the Slot Type field 1020 to identify the data type for the data bits 1016 in the Information field 1010 of the received burst 1000. The receiving device uses a (196, 96) BPTC Decoder to decode the bits that were encoded by the (196, 96) BPTC Encoder in the transmitting device. The receiving device then selects the error injection mask corresponding to the decoded data type bits 1024. If the receiver decodes the data type correctly, it will select the error injection mask corresponding to Voice LC Header data type (in this case $969696_{16}$)

The receiving device applies the selected error injection mask (using bitwise modulo 2 arithmetic) to the data bits 1016 and CRC parity 1018, at a step 1208, to (in this case) modify the CRC parity 1018. The receiving device performs an error detection calculation, at a step 1210, (in this case a CRC calculation) on the modified Information field. From the CRC calculation, at a step 1212, the receiving device determines whether to continue normal processing at a step 1216 when the CRC calculation indicate no decoding errors in decoding the data type bits 1024 and in decoding the LC bits 1016. If the CRC calculation indicates a decoding error (which could be in either the data type or data bits), the receiving device performs error handling at a step 1214, for instance, in a manner as discussed above.

Thus, where the receiving device correctly decodes the data type and the data bits, the CRC will so indicate, with the particular indication depending on how the CRC calculation was performed. In one embodiment, for example as discussed in general above, the CRC calculation can be performed on just the LC data bits 1016 and a comparison made between the calculated CRC and the CRC bits 1018 prior to the Information field being modified using the error injection mask. Where the two values are equal, this indicates that the receiving device correctly decoded the data type bits 1024 and correctly decoded the LC bits 1016. A difference in the values similarly indicates that the CRC bits 1018 and/or the LC bits 1018 were incorrectly decoded. In another embodiment, also as discussed above, the CRC calculation can be performed on both the LC data bits 1016 and the current CRC bits 1018 and a comparison made between the calculated CRC and a predetermined bit value such as zero. Where the calculated CRC is zero, this indicates that the receiving device correctly decoded the data type bits 1024 and correctly decoded the LC bits 1016. A CRC other than zero indicates that the CRC bits 1018 and/or the LC bits 1018 were incorrectly decoded.

In the foregoing specification, specific embodiments of the present invention have been described. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

What is claimed is:

1. A method for error detection in a data block, comprising the steps of:
   generating a data block comprising a first field having a first plurality of bits that includes an error detection portion indicating an error detection value based on a first portion of the first plurality of bits and used for error detection in decoding the first portion of the first plurality of bits, and the data block further comprising at least a second field having a second plurality of bits;
   selecting an error injection mask based on the second plurality of bits;
   modifying the first plurality of bits with the error injection mask to generate a modified first plurality of bits that is used for error detection in decoding the second plurality of bits; and
   transmitting the data block with the modified first plurality of bits.

2. The method of claim 1, wherein the data block comprises a digital mobile radio (DMR) Time Division Multiple Access (TDMA) burst as defined in ETSI (European Telecommunications Standards Institute) TS (Technical Specification) 102 361-1.

3. The method of claim 1, wherein:
   the first field comprises information and the first plurality of bits comprises error detection bits and data bits of a first data type;
   the second field comprises a data type field, and the second plurality of bits indicates the first data type; and
   the error injection mask corresponds to the first data type.

4. The method of claim 3, wherein modifying the first plurality of bits comprises at least one of:
   modifying the error detection bits; and
   modifying the data bits.

5. The method of claim 4, wherein the error injection mask is selected from a group comprising:
   $00_{16}$, $03_{16}$, $0c_{16}$, $0f_{16}$;
   $30_{16}$, $33_{16}$, $3c_{16}$, $3f_{16}$;
   $55_{16}$, $56_{16}$, $59_{16}$, $5a_{16}$;
   $65_{16}$, $66_{16}$, $69_{16}$, $6a_{16}$;
   $95_{16}$, $96_{16}$, $99_{16}$, $9a_{16}$;
   $a5_{16}$, $a6_{16}$, $a9_{16}$, $aa_{16}$;
   $c0_{16}$, $c3_{16}$, $cc_{16}$, $cf_{16}$;
   $f0_{16}$, $f3_{16}$, $fc_{16}$, $ff_{16}$;
   $000_{8}$, $017_{8}$, $063_{8}$, $074_{8}$;
   $125_{8}$, $132_{8}$, $146_{8}$, $151_{8}$;
   $226_{8}$, $231_{8}$, $245_{8}$, $252_{8}$;
   $303_{8}$, $314_{8}$, $360_{8}$, $377_{8}$;
   $400_{8}$, $417_{8}$, $463_{8}$, $474_{8}$;
   $525_{8}$, $532_{8}$, $546_{8}$, $551_{8}$;
   $626_{8}$, $631_{8}$, $645_{8}$, $652_{8}$;
   $703_{8}$, $714_{8}$, $760_{8}$, $777_{8}$;
   $0000_{16}$, $00ff_{16}$, $0f0f_{16}$, $0ff0_{16}$;
   $3333_{16}$, $33cc_{16}$, $3c3c_{16}$, $3cc3_{16}$;
   $5555_{16}$, $55aa_{16}$, $5a5a_{16}$, $5aa5_{16}$;
   $6666_{16}$, $6699_{16}$, $6969_{16}$, $6996_{16}$;
   $9669_{16}$, $9696_{16}$, $9966_{16}$, $9999_{16}$;
   $a55a_{16}$, $a5a5_{16}$, $aa55_{16}$, $aaaa_{16}$;
   $c33c_{16}$, $c3c3_{16}$, $cc33_{16}$, $cccc_{16}$,
   $f00f_{16}$, $f0f0_{16}$, $ff00_{16}$, $ffff_{16}$;
   $000000_{16}$, $00ff00_{16}$, $0f0f0f_{16}$, $0ff00f_{16}$;
   $333333_{16}$, $33cc33_{16}$, $3c3c3c_{16}$, $3cc33c_{16}$;
   $555555_{16}$, $55aa55_{16}$, $5a5a5a_{16}$, $5aa55a_{16}$;
   $666666_{16}$, $669966_{16}$, $696969_{16}$, $699669_{16}$;
   $966996_{16}$, $969696_{16}$, $996699_{16}$, $999999_{16}$;
   $a55aa5_{16}$, $a5a5a5_{16}$, $aa55aa_{16}$, $aaaaaa_{16}$;
   $c33cc3_{16}$, $c3c3c3_{16}$, $cc33cc_{16}$, $cccccc_{16}$;
   $f00ff0_{16}$, $f0f0f0_{16}$, $ff00ff_{16}$, $ffffff_{16}$;
   $00000000_{16}$, $00ff00ff_{16}$, $0f0f0f0f_{16}$, $0ff00ff0_{16}$;
   $33333333_{16}$, $33cc33cc_{16}$, $3c3c3c3c_{16}$, $3cc333c3_{16}$;
   $55555555_{16}$, $55aa55aa_{16}$, $5a5a5a5a_{16}$, $5aa55aa5_{16}$;
   $66666666_{16}$, $66996699_{16}$, $69696969_{16}$, $69966996_{16}$;
   $96699669_{16}$, $96969696_{16}$, $99669966_{16}$, $99999999_{16}$;
   $a55aa55a_{16}$, $a5a5a5a5_{16}$, $aa55aa55_{16}$, $aaaaaaaa_{16}$;
   $c33cc33c_{16}$, $c3c3c3c3_{16}$, $cc33cc33_{16}$, $cccccccc_{16}$;
   $f00ff00f_{16}$, $f0f0f0f0_{16}$, $ff00ff00_{16}$, $ffffffff_{16}$, for modifying the error detection bits.

6. The method of claim 1, wherein the error detection portion of the first plurality of bits comprises one of a Cyclic Redundancy Check, a Checksum and a Simple Parity Check.

7. The method of claim 1, wherein the error injection mask comprises a predetermined plurality of bits and modifying the first plurality of bits comprises combining the error injection mask with the first plurality of bits using bitwise modulo 2 addition.

8. The method of claim 1, wherein the data block further comprising at least a third field having a third plurality of bits, and the method further comprising the steps of:
   selecting a second error injection mask based on the third plurality of bits; and
   further modifying the first plurality of bits with the second error injection mask to generate the modified first plurality of bits that is further used for error detection in decoding the third plurality of bits.

9. A method for error detection in a data block, comprising the steps of:
  receiving a data block comprising a first field having a first plurality of bits that includes an error detection portion indicating an error detection value, the data block further comprising at least a second field having a second plurality of bits;
  decoding the second plurality of bits to generate decoding results;
  selecting an error injection mask based on the decoding results;
  modifying the first plurality of bits using the error injection mask to generate a modified first plurality of bits that includes a resultant error detection value; and
  detecting whether the decoding results for the second field are correct based on the resultant error detection value indicated in the first field.

10. The method of claim 9, wherein detecting whether the decoding results for the second field are correct comprises the steps of:
  calculating an error detection value based on at least a portion of the modified first plurality of bits; and
  comparing the calculated error detection value to the resultant error detection value, wherein the decoding results for the second field are correct when the calculated error detection is equal to the resultant error detection value.

11. The method of claim 10, wherein the data block comprises a digital mobile radio (DMR) Time Division Multiple Access (TDMA) burst as defined in ETSI (European Telecommunications Standards Institute) TS (Technical Specification) 102 361-1.

12. The method of claim 10, wherein:
  the first field comprises information and the first plurality of bits comprises error detection bits and data bits of a first data type;
  the second field comprises a data type field, and the second plurality of bits indicates the first data type; and
  the error injection mask corresponds to the first data type.

13. The method of claim 12, wherein modifying the first plurality of bits comprises at least one of:
  modifying the error detection bits; and
  modifying the data bits.

14. The method of claim 13, wherein the error injection mask is selected from a group comprising:
  $00_{16}$, $03_{16}$, $0c_{16}$, $0f_{16}$;
  $30_{16}$, $33_{16}$, $3c_{16}$, $3f_{16}$;
  $55_{16}$, $56_{16}$, $59_{16}$, $5a_{16}$;
  $65_{16}$, $66_{16}$, $69_{16}$, $6a_{16}$;
  $95_{16}$, $96_{16}$, $99_{16}$, $9a_{16}$;
  $a5_{16}$, $a6_{16}$, $a9_{16}$, $aa_{16}$;
  $c0_{16}$, $c3_{16}$, $cc_{16}$, $cf_{16}$;
  $f0_{16}$, $f3_{16}$, $fc_{16}$, $ff_{16}$;
  $000_8$, $017_8$, $063_8$, $074_8$;
  $125_8$, $132_8$, $146_8$, $151_8$;
  $226_8$, $231_8$, $245_8$, $252_8$;
  $303_8$, $314_8$, $360_8$, $377_8$;
  $400_8$, $417_8$, $463_8$, $474_8$;
  $525_8$, $532_8$, $546_8$, $551_8$;
  $626_8$, $631_8$, $645_8$, $652_8$;
  $703_8$, $714_8$, $760_8$, $777_8$;
  $0000_{16}$, $00ff_{16}$, $0f0f_{16}$, $0ff0_{16}$;
  $3333_{16}$, $33cc_{16}$, $3c3c_{16}$, $3cc3_{16}$;
  $5555_{16}$, $55aa_{16}$, $5a5a_{16}$, $5aa5_{16}$;
  $6666_{16}$, $6699_{16}$, $6969_{16}$, $6996_{16}$;
  $9669_{16}$, $9696_{16}$, $9966_{16}$, $9999_{16}$;
  $a55a_{16}$, $a5a5_{16}$, $aa55_{16}$, $aaaa_{16}$;
  $c33c_{16}$, $c3c3_{16}$, $cc33_{16}$, $cccc_{16}$;
  $f00f_{16}$, $f0f0_{16}$, $ff00_{16}$, $ffff_{16}$;
  $000000_{16}$, $00ff00_{16}$, $0f0f0f_{16}$; $0ff00f_{16}$;
  $333333_{16}$, $33cc33_{16}$, $3c3c3c_{16}$, $3cc33c_{16}$;
  $555555_{16}$, $55aa55_{16}$, $5a5a5a_{16}$, $5aa55a_{16}$;
  $666666_{16}$, $669966_{16}$, $696969_{16}$, $699669_{16}$;
  $966996_{16}$, $969696_{16}$, $996699_{16}$, $999999_{16}$;
  $a55aa5_{16}$, $a5a5a5_{16}$, $aa55aa_{16}$, $aaaaaa_{16}$;
  $c33cc3_{16}$, $c3c3c3_{16}$, $cc33cc_{16}$, $CCCCCC_{16}$;
  $f00ff0_{16}$, $f0f0f0_{16}$, $ff00ff_{16}$, $ffffff_{16}$;
  $00000000_{16}$, $00ff00ff_{16}$, $0f0f0f0f_{16}$, $0ff00ff0_{16}$;
  $33333333_{16}$, $33cc33cc_{16}$, $3c3c3c3c_{16}$, $3cc333c3_{16}$;
  $55555555_{16}$, $55aa55aa_{16}$, $5a5a5a5a_{16}$, $5aa55aa5_{16}$;
  $66666666_{16}$, $66996699_{16}$, $69696969_{16}$, $69966996_{16}$;
  $96699669_{16}$, $96969696_{16}$, $99669966_{16}$, $99999999_{16}$;
  $a55aa55a_{16}$, $a5a5a5a5_{16}$, $aa55aa55_{16}$, $aaaaaaaa_{16}$;
  $c33cc33c_{16}$, $C3C3C3C3_{16}$, $CC33CC33_{16}$, $CCCCCCCC_{16}$,
  $f00ff00f_{16}$, $f0f00f0f_{16}$, $ff00ff00_{16}$, $ffffffff_{16}$, for modifying the error detection bits.

15. The method of claim 10, wherein the data block further comprising at least a third field having a third plurality of bits, and the method further comprising the steps of:
  decoding the third plurality of bits to generate second decoding results;
  selecting a second error injection mask based on the second decoding results;
  further modifying the first plurality of bits with the second error injection mask to generate the modified first plurality of bits that includes the resultant error detection value; and
  further detecting whether the second decoding results for the third field are correct based on the resultant error detection value indicated in the first field.

16. A device for error detection in a data block, comprising:
  a processing device:
  generating a data block comprising a first field having a first plurality of bits that includes an error detection portion indicating an error detection value based on a first portion of the first plurality of bits and used for error detection in decoding the first portion of the first plurality of bits, and the data block further comprising at least a second field having a second plurality of bits;
  selecting an error injection mask based on the second plurality of bits; and
  modifying the first plurality of bits with the error injection mask to generate a modified first plurality of bits that is used for error detection in decoding the second plurality of bits; and
  a transmitter transmitting the data block with the modified first plurality of bits.

17. The device of claim 16, wherein the device comprises one of a mobile station and a base station.

18. The device of claim 16 further comprising:
  a receiver receiving a second data block comprising a third field having a third plurality of bits that includes an error detection portion indicating an error detection value, the second data block further comprising at least a fourth field having a fourth plurality of bits;
  decoding the fourth plurality of bits to generate decoding results;
  selecting a second error injection mask based on the decoding results;
  modifying the third plurality of bits using the second error injection mask to generate a modified third plurality of bits that includes a resultant error detection value; and detecting whether the decoding results for the fourth field are correct based on the resultant error detection value indicated in the third field.

19. The device of claim 16, wherein the device operates in accordance with ETSI (European Telecommunications Standards Institute) TS (Technical Specification) 102 361-1.

20. The device of claim 16, wherein the data block further comprising at least a third field having a third plurality of bits, and the processing device further:

selecting a second error injection mask based on the third plurality of bits; and further modifying the first plurality of bits with the second error injection mask to generate the modified first plurality of bits that is further used for error detection in decoding the third plurality of bits.

* * * * *